United States Patent
Pagaila et al.

(10) Patent No.: US 7,968,979 B2
(45) Date of Patent: Jun. 28, 2011

(54) INTEGRATED CIRCUIT PACKAGE SYSTEM WITH CONFORMAL SHIELDING AND METHOD OF MANUFACTURE THEREOF

(75) Inventors: Reza Argenty Pagaila, Singapore (SG); Linda Pei Ee Chua, Singapore (SG); Byung Tai Do, Singapore (SG)

(73) Assignee: Stats Chippac Ltd., Singapore (SG)

( * ) Notice: Subject to any disclaimer, the term of this patent is extended or adjusted under 35 U.S.C. 154(b) by 22 days.

(21) Appl. No.: 12/146,124

(22) Filed: Jun. 25, 2008

(65) Prior Publication Data

US 2009/0321898 A1    Dec. 31, 2009

(51) Int. Cl.
- H01L 23/552    (2006.01)
- H01L 23/48    (2006.01)
- H01L 23/28    (2006.01)

(52) U.S. Cl. ......... 257/660; 257/E23.114; 257/E23.116; 257/E23.01; 257/E21.499; 257/777; 257/693; 257/787; 257/686; 257/685; 257/679; 257/684; 257/704; 257/710; 257/707

(58) Field of Classification Search ............... 257/777, 257/686, 685, 679, 684, 660, E23.114, E21.499, 257/704, 710, 707, E23.116, E23.01, 787, 257/693
See application file for complete search history.

(56) References Cited

U.S. PATENT DOCUMENTS

| | | | |
|---|---|---|---|
| 5,468,681 A | 11/1995 | Pasch | |
| 5,770,889 A | 6/1998 | Rostoker et al. | |
| 5,889,652 A | 3/1999 | Turturro | |
| 6,444,921 B1 | 9/2002 | Wang et al. | |
| 6,838,761 B2 | 1/2005 | Karnezos | |
| 6,841,858 B2 | 1/2005 | Shim et al. | |
| 6,956,283 B1* | 10/2005 | Peterson | 257/680 |
| 7,187,060 B2 | 3/2007 | Usui | |
| 7,309,913 B2 | 12/2007 | Shim et al. | |
| 7,364,945 B2 | 4/2008 | Shim et al. | |
| 7,613,010 B2* | 11/2009 | Ono et al. | 361/784 |
| 2004/0063246 A1* | 4/2004 | Karnezos | 438/108 |
| 2006/0027902 A1 | 2/2006 | Ararao et al. | |
| 2007/0194423 A1 | 8/2007 | Yim et al. | |
| 2008/0171402 A1* | 7/2008 | Karnezos | 438/15 |
| 2009/0001612 A1* | 1/2009 | Song et al. | 257/787 |
| 2009/0085199 A1 | 4/2009 | Yoon et al. | |
| 2009/0194853 A1* | 8/2009 | Jang et al. | 257/660 |
| 2009/0243069 A1* | 10/2009 | Camacho et al. | 257/686 |
| 2009/0257614 A1* | 10/2009 | Mei et al. | 381/355 |
| 2010/0008056 A1* | 1/2010 | Ono et al. | 361/784 |

* cited by examiner

*Primary Examiner* — Alexander O Williams
(74) *Attorney, Agent, or Firm* — Mikio Ishimaru (57) ABSTRACT

An integrated circuit package system includes: providing a substrate with an integrated circuit mounted thereover; mounting a structure, having ground pads, over the integrated circuit; encapsulating the integrated circuit with an encapsulation while leaving the structure partially exposed; and attaching a conformal shielding to the encapsulation and electrically connected to the grounding pads.

20 Claims, 8 Drawing Sheets

INTEGRATED CIRCUIT PACKAGE SYSTEM WITH CONFORMAL SHIELDING AND METHOD OF MANUFACTURE THEREOF

CROSS-REFERENCE TO RELATED APPLICATION(S)

The present application contains subject matter related to a co-pending U.S. patent application Ser. No. 11/865,064. The related application is assigned to STATS ChipPAC Ltd.

TECHNICAL FIELD

The present invention relates generally to integrated circuits and more particularly to a system for utilizing conformal shielding with an integrated circuit package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a substrate with an integrated circuit mounted thereover; mounting a structure, having ground pads, over the integrated circuit; encapsulating the integrated circuit with an encapsulation while leaving the structure partially exposed; and attaching a conformal shielding to the encapsulation and electrically connected to the grounding pads.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used. The term "fan-in" is used to describe inputs and outputs from an integrated circuit package system, which are directed through a structure such as an interposer.

Figure 1:
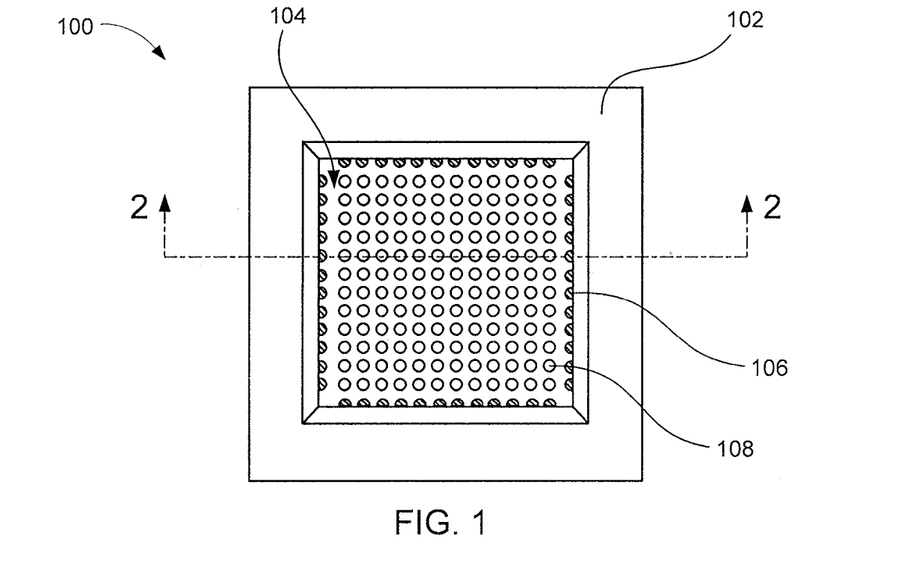
FIG. 1 is a top view of an integrated circuit package system in a first embodiment of the present invention.

Referring now to FIG. 1, therein is shown a top view of an integrated circuit package system 100 in a first embodiment of the present invention. The integrated circuit package system 100 is shown having a conformal shielding 102 encircling a structure such as an interposer 104.

The interposer 104 is shown having grounding pads 106 connected to the conformal shielding 102. Further the interposer 104 is shown having conductors such as exposed conductors 108.

Figure 2:
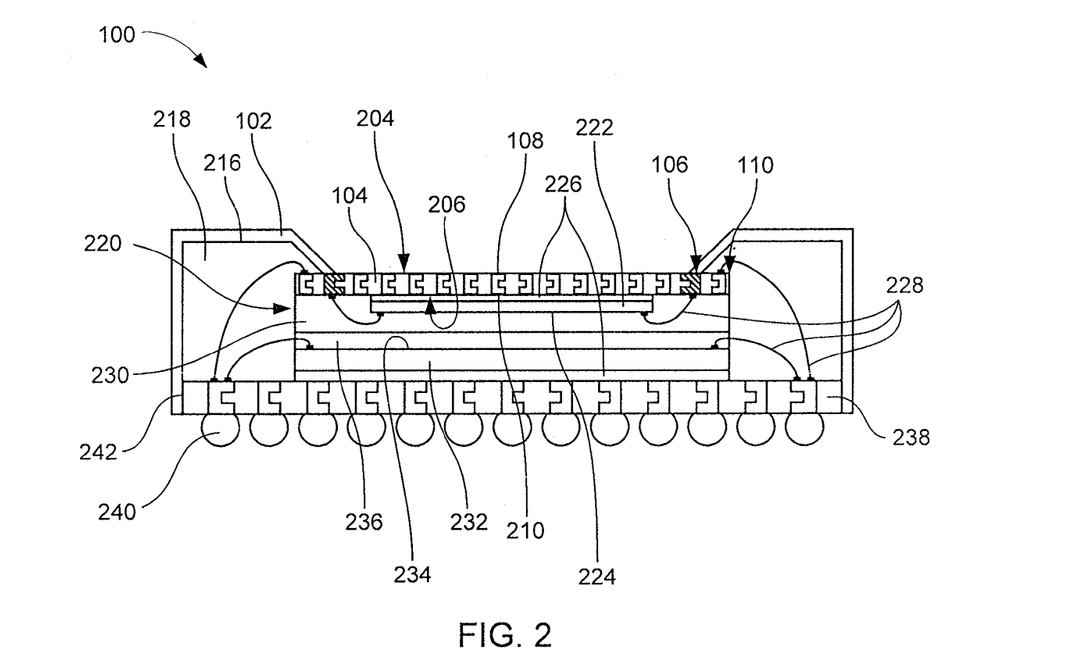
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having the interposer 104 having two functional sides, such as a first functional side 204 and a second functional side 206, which allow electrical signals to be routed between exposed conductors, such as the exposed conductors 108, exposed from the first functional side 204, and exposed conductors 210, exposed from the second functional side 206.

Further, exposed from the first functional side 204 and exposed from the second functional side 206 are the grounding pads 106. It has been unexpectedly discovered that the use of the grounding pads 106 on the interposer 104 allows for an exceptionally compact grounding of the conformal shielding 102, while still allowing the functionality of multiple fan-in inputs into the package via the interposer 104.

The interposer 104 is typically a UV stabilized woven glass and epoxy resin with etched copper conductive pathways. The conformal shielding 102 is attached to a top exterior surface 216 and a side exterior surface 217 of an encapsulation 218. The conformal shielding 102 such as a thin-film copper or aluminum shield acts as a faraday cage, protecting the internal components of the package from RF interference.

The interposer 104 is partially exposed from the encapsulation 218. The interposer 104 is part of an inner stacking module (ISM) 220. The ISM 220 includes an ISM wire-bonded die 222 with an active side 224 mounted below the interposer 104. The ISM wire-bonded die 222 is attached to the interposer 104 with a die attach adhesive 226.

The active side 224 of the ISM wire-bonded die 222 is connected to the exposed conductors 210 exposed from the second functional side 206 of the interposer 104 with interconnects such as bond wires 228. The ISM wire-bonded die 222 is encapsulated by an ISM encapsulation 230.

Below the ISM 220, an integrated circuit such as a wire-bonded die 232 with an active side 234 is mounted with the active side 234 facing the ISM 220. The active side 234 of the wire-bonded die 232 is attached to the ISM 220 with a wire-in-film adhesive 236.

The wire-in-film adhesive 236 has a low viscosity and, as temperature increases, the viscosity gets lower. Therefore, the wire-in-film adhesive 236 can be easily pressed above and around the wire-bonded die 232 and then cured to harden the wire-in-film adhesive 236.

It has been discovered that the wire-in-film adhesive 236 should be a thermally conductive dielectric material. The wire-in-film adhesive 236 can be made of a B-stage material that can be hardened after curing and can maintain a predetermined thickness.

The active side 234 of the wire-bonded die 232 is connected to a substrate 238 mounted below the wire-bonded die 232 with the bond wires 228. The substrate 238 may be a laminated plastic or ceramic substrate and is attached with the die attach adhesive 226.

The interposer 104 is also connected to the substrate 238 with the bond wires 228. The grounding pads 106 are exposed from the substrate 238. Mounted below the substrate 238 are external interconnects 240 such as solder balls.

The encapsulation 218 encapsulates the wire-bonded die 232 and the bond wires 228. The conformal shielding 102 attached to the exterior surface 216 of the encapsulation 218 is also attached to a vertical edge 242 of the substrate 238. The conformal shielding 102 is on and around a perimeter 110 of a side of the interposer 104 opposite the integrated circuit, such as the first functional side 204, and electrically connected to the grounding pads 106.

Figure 3:
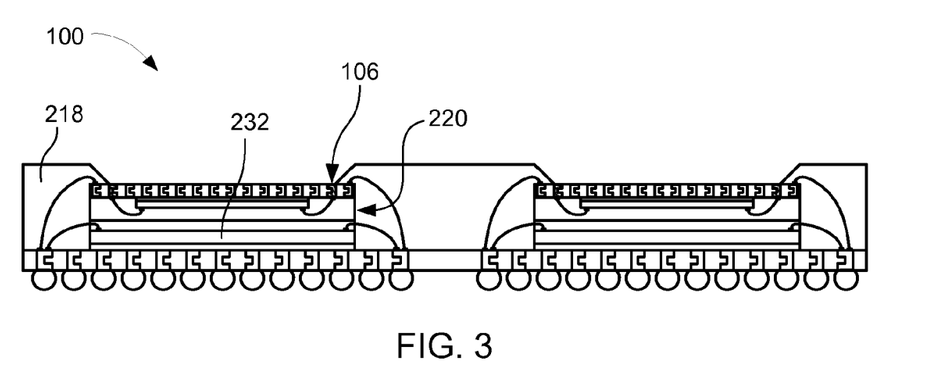
FIG. 3 is the integrated circuit package system of FIG. 2 in an encapsulation phase of manufacture.

Referring now to FIG. 3, therein is shown the integrated circuit package system 100 of FIG. 2 in an encapsulation phase of manufacture. The integrated circuit package system 100 is shown having the ISM 220, the wire-bonded die 232, and the bond wires 228 encapsulated with the encapsulation 218. The encapsulation 218 is shown with the exterior surface 216 exposed.

Figure 4:
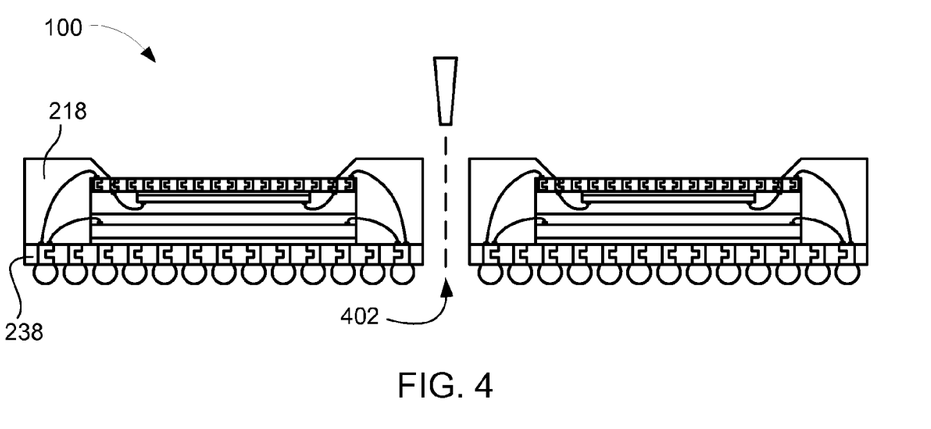
FIG. 4 is the integrated circuit package system of FIG. 3 in a singulation phase of manufacture.

Referring now to FIG. 4 is the integrated circuit package system 100 of FIG. 3 in a singulation phase of manufacture. The integrated circuit package system 100 is shown having the encapsulation 218 and the substrate singulated with a singulation cut 402.

Figure 5:
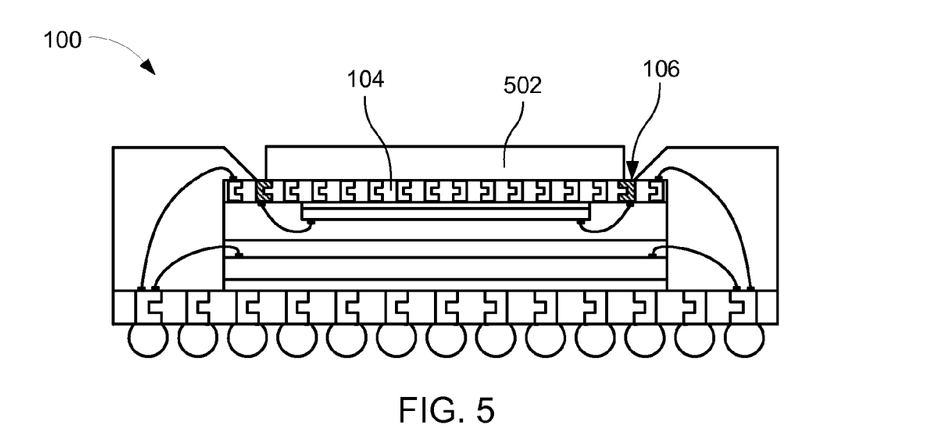
FIG. 5 is the integrated circuit package system of FIG. 3 in an interposer protection phase of manufacture.

Referring now to FIG. 5 is the integrated circuit package system 100 of FIG. 3 in an interposer protection phase of manufacture. The integrated circuit package system 100 is shown having a protective cover 502 such as photoresist attached to the interposer 104. The protective cover 502 leaves substantial portions of the grounding pads 106 exposed.

Figure 6:
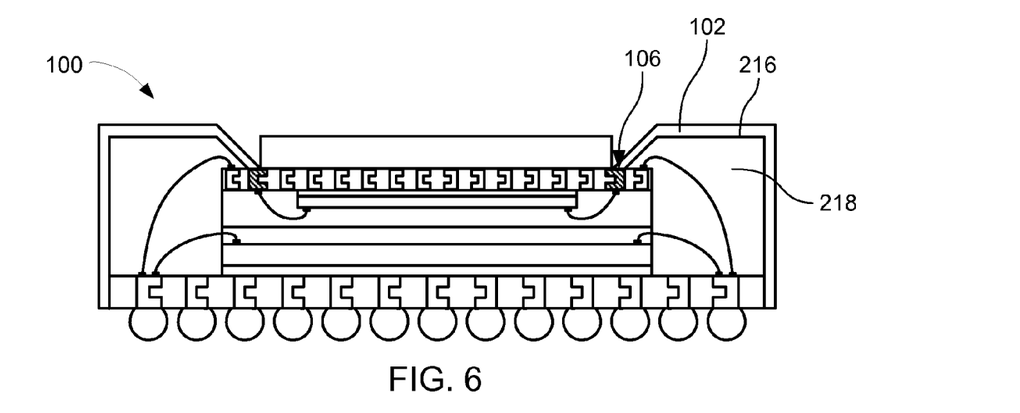
FIG. 6 is the integrated circuit package system of FIG. 3 in a shielding application phase of manufacture.

Referring now to FIG. 6 is the integrated circuit package system 100 of FIG. 3 in a shielding application phase of manufacture. The integrated circuit package system 100 is shown having the conformal shielding 102 attached to the exterior surface 216 of the encapsulation 218 and electrically connected to the grounding pads 106.

Figure 7:
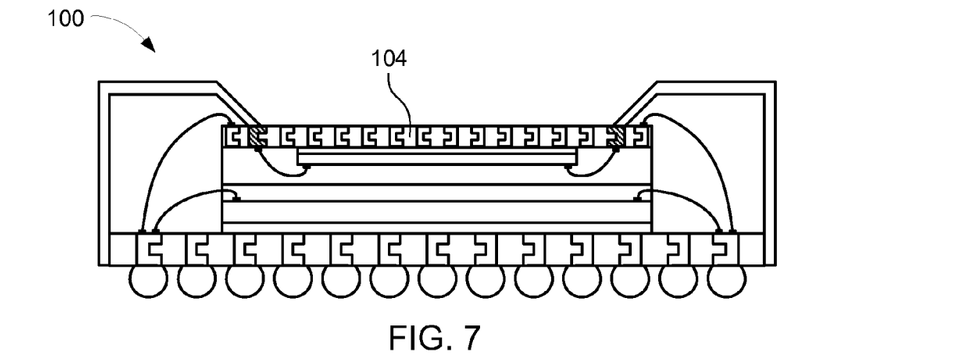
FIG. 7 is the integrated circuit package system of FIG. 3 in an interposer exposure phase of manufacture.

Referring now to FIG. 7 is the integrated circuit package system 100 of FIG. 3 in an interposer exposure phase of manufacture. The integrated circuit package system 100 is shown having the interposer 104 exposed.

Figure 8:
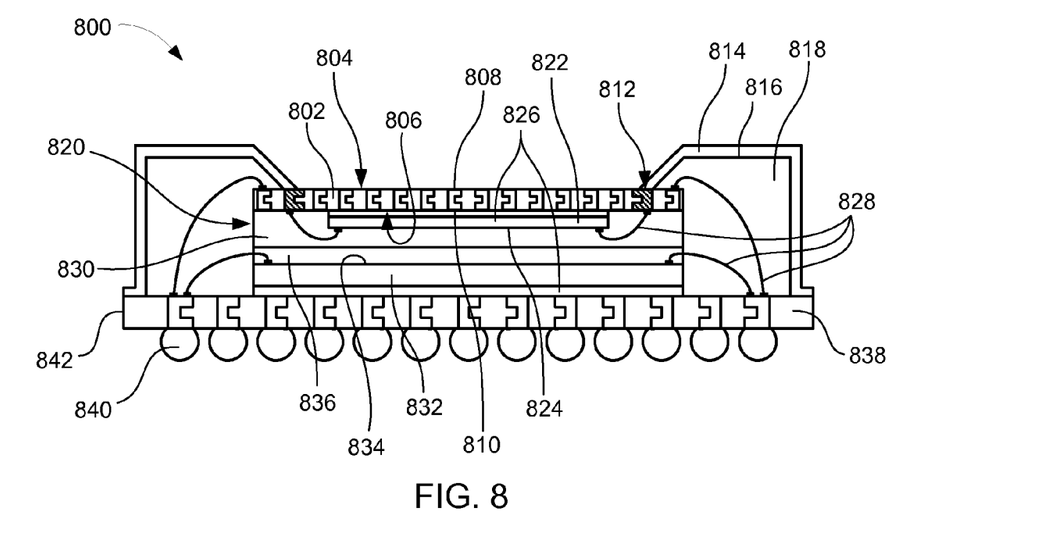
FIG. 8 is a cross-sectional view of an integrated circuit package system in a second embodiment of the present invention, and in an encapsulation phase of manufacture.

Referring now to FIG. 8 a cross-sectional view of an integrated circuit package system 800 in a second embodiment of the present invention, and in an encapsulation phase of manufacture. The integrated circuit package system 800 is shown having a structure such as an interposer 802.

The interposer 802 is shown having two functional sides, such as a first functional side 804 and a second functional side 806, which allow electrical signals to be routed between exposed conductors, such as exposed conductors 808, exposed from the first functional side 804, and exposed conductors 810, exposed from the second functional side 806.

Further, exposed from the first functional side 804 and exposed from the second functional side 806 are grounding pads 812. It has been unexpectedly discovered that the use of the grounding pads 812 on the interposer 802 allows for an exceptionally compact grounding of a conformal shielding 814, while still allowing the functionality of multiple fan-in inputs into the package via the interposer 802.

The interposer 802 is typically a UV stabilized woven glass and epoxy resin with etched copper conductive pathways. The conformal shielding 814 is attached to an exterior surface 816 of an encapsulation 818. The conformal shielding 814 such as a thin-film copper or aluminum shield acts as a faraday cage, protecting the internal components of the package from RF interference.

The interposer 802 is partially exposed from the encapsulation 818. The interposer 802 is part of an inner stacking module (ISM) 820. The ISM 820 includes an ISM wire-bonded die 822 with an active side 824 mounted below the interposer 802. The ISM wire-bonded die 822 is attached to the interposer 802 with a die attach adhesive 826.

The active side 824 of the ISM wire-bonded die 822 is connected to the exposed conductors 810 exposed from the second functional side 806 of the interposer 802 with interconnects such as bond wires 828. The ISM wire-bonded die 822 is encapsulated by an ISM encapsulation 830.

Below the ISM 820, an integrated circuit such as a wire-bonded die 832 with an active side 834 is mounted with the active side 834 facing the ISM 820. The active side 834 of the wire-bonded die 832 is attached to the ISM 820 with a wire-in-film adhesive 836.

The wire-in-film adhesive 836 has a low viscosity and, as temperature increases, the viscosity gets lower. Therefore, the wire-in-film adhesive 836 can be easily pressed above and around the wire-bonded die 832 and then cured to harden the wire-in-film adhesive 836.

It has been discovered that the wire-in-film adhesive 836 should be a thermally conductive dielectric material. The wire-in-film adhesive 836 can be made of a B-stage material that can be hardened after curing and can maintain a predetermined thickness.

The active side 834 of the wire-bonded die 832 is connected to a substrate 838 mounted below the wire-bonded die 832 with the bond wires 828. The substrate 838 may be a laminated plastic or ceramic substrate and is attached with the die attach adhesive 826.

The interposer 802 is also connected to the substrate 838 with the bond wires 828. The grounding pads 812 are exposed from the substrate 838. Mounted below the substrate 838 are external interconnects 840 such as solder balls.

The encapsulation 818 encapsulates the wire-bonded die 832 and the bond wires 828. The conformal shielding 814 attached to the exterior surface 816 of the encapsulation 818 is not attached to a vertical edge 842 of the substrate 838, leaving the vertical edge 842 exposed.

Figure 9:
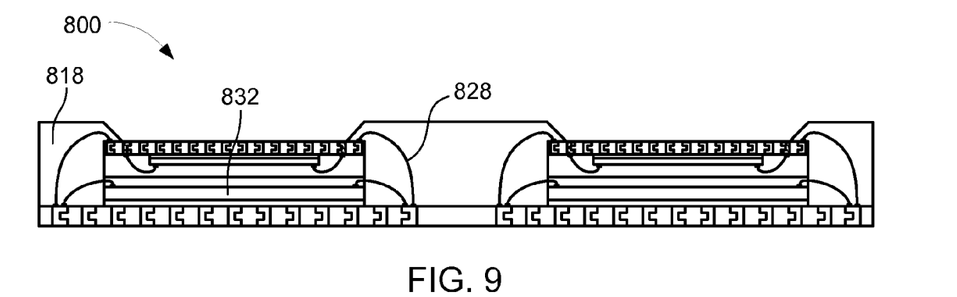
FIG. 9 is the integrated circuit package system of FIG. 8 in a partial saw isolation phase of manufacture.

Referring now to FIG. 9 is the integrated circuit package system 800 of FIG. 8 in a partial saw isolation phase of manufacture. The integrated circuit package system 800 is shown having the encapsulation 818 encapsulating the wire-bonded die 832 and the bond wires 828.

Figure 10:
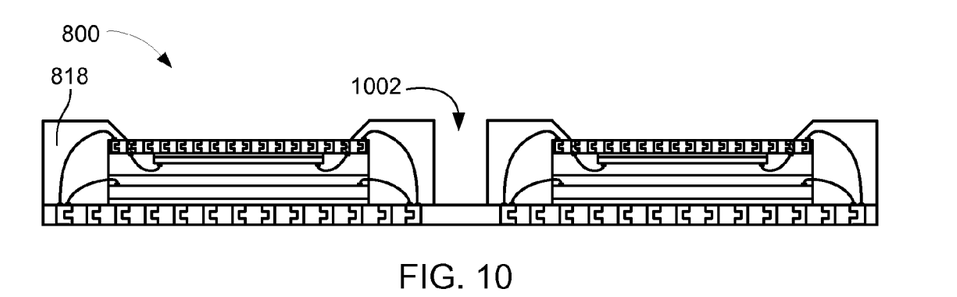
FIG. 10 is the integrated circuit package system of FIG. 8 in an interposer protection phase of manufacture.

Referring now to FIG. 10 is the integrated circuit package system 800 of FIG. 8 in an interposer protection phase of manufacture. The integrated circuit package system 800 is shown having a partial saw isolation groove 1002 through the encapsulation 818.

Figure 11:
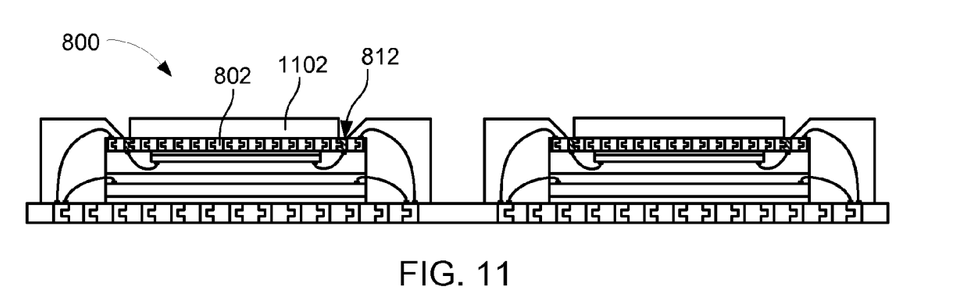
FIG. 11 is the integrated circuit package system of FIG. 8 in a shielding application phase of manufacture.

Referring now to FIG. 11 is the integrated circuit package system 800 of FIG. 8 in a shielding application phase of manufacture. The integrated circuit package system 800 is shown having a protective cover 1102 such as photoresist attached to the interposer 802. The protective cover 1102 leaves a substantial portion of the grounding pads 812 exposed.

Figure 12:
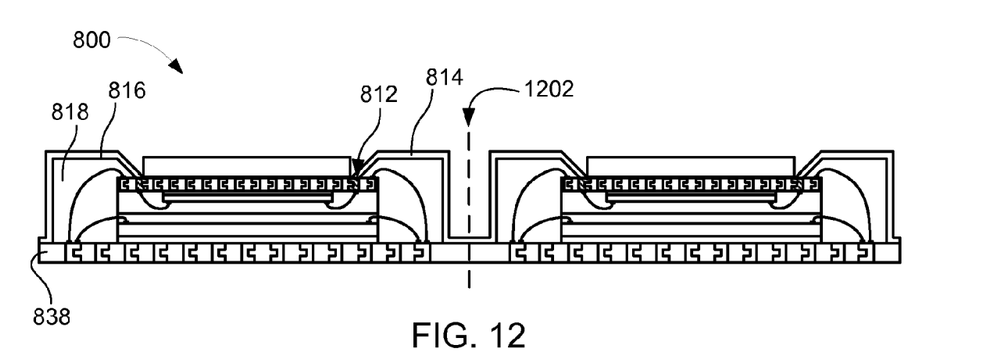
FIG. 12 is the integrated circuit package system of FIG. 8 a singulation phase of manufacture.

Referring now to FIG. 12 is the integrated circuit package system 800 of FIG. 8 in a singulation phase of manufacture. The integrated circuit package system 800 is shown having the conformal shielding 814 attached to the exterior surface 816 of the encapsulation 818 and electrically connected to the grounding pads 812. The substrate 838 is also shown with a singulation path 1202.

Figure 13:
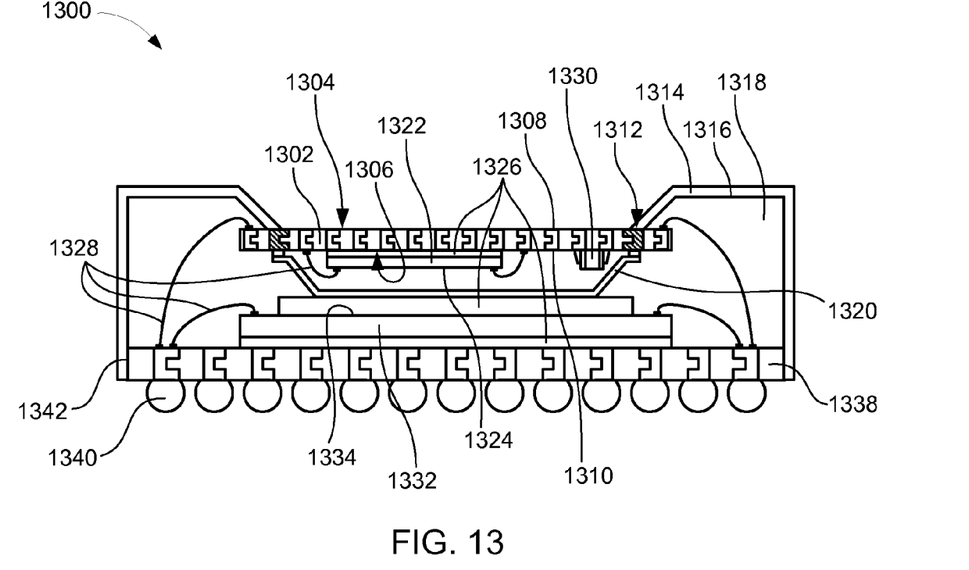
FIG. 13 is a cross-sectional view of an integrated circuit package system in a third embodiment of the present invention.

Referring now to FIG. 13, therein is shown a cross-sectional view of an integrated circuit package system 1300 in a third embodiment of the present invention. The integrated circuit package system 1300 is shown having a structure such as an interposer 1302.

The interposer 1302 is shown having two functional sides, such as a first functional side 1304 and a second functional side 1306, which allow electrical signals to be routed between exposed conductors, such as exposed conductors 1308, exposed from the first functional side 1304, and exposed conductors 1310, exposed from the second functional side 1306.

Further, exposed from the first functional side 1304 and exposed from the second functional side 1306 are grounding pads 1312. It has been unexpectedly discovered that the use of the grounding pads 1312 on the interposer 1302 allows for an exceptionally compact grounding of a conformal shielding 1314, while still allowing the functionality of multiple fan-in inputs into the package via the interposer 1302.

The interposer 1302 is typically a UV stabilized woven glass and epoxy resin with etched copper conductive pathways. The conformal shielding 1314 is attached to an exterior surface 1316 of an encapsulation 1318. The conformal shielding 1314 such as a thin-film copper or aluminum shield acts as a faraday cage, protecting the internal components of the package from RF interference.

The interposer 1302 is partially exposed from the encapsulation 1318. Below the interposer 1302 a shielding cage 1320 is mounted. The shielding cage 1320 is connected to the grounding pads 1312 exposed from the interposer 1302.

Between the shielding cage 1320 and the interposer 1302 is an integrated circuit such as an inverted wire-bonded die 1322 with an active side 1324. The inverted wire-bonded die 1322 is attached to the interposer 1302 with a die attach adhesive 1326.

The active side 1324 of the inverted wire-bonded die 1322 is connected to the exposed conductors 1310 exposed from the second functional side 1306 of the interposer 1302 with interconnects such as bond wires 1328. Further, mounted between the shielding cage 1320 and the interposer 1302 is a passive component 1330 such as a resister, capacitor, or an inductor.

Below the shielding cage 1320, an integrated circuit such as a wire-bonded die 1332 with an active side 1334 is mounted with the active side 1334 facing the shielding cage 1320. The active side 1334 of the wire-bonded die 1332 is attached to the shielding cage 1320 with the die attach adhesive 1326.

The active side 1334 of the wire-bonded die 1332 is connected to a substrate 1338 mounted below the wire-bonded die 1332 with the bond wires 1328. The substrate 1338 may be a laminated plastic or ceramic substrate and is attached with the die attach adhesive 1326.

The interposer 1302 is also connected to the substrate 1338 with the bond wires 1328. Mounted below the substrate 1338 are external interconnects 1340 such as solder balls. The encapsulation 1318 encapsulates the wire-bonded die 1332 and the bond wires 1328.

The conformal shielding 1314 attached to the exterior surface 1316 of the encapsulation 1318 is also attached to a vertical edge 1342 of the substrate 1338.

Figure 14:
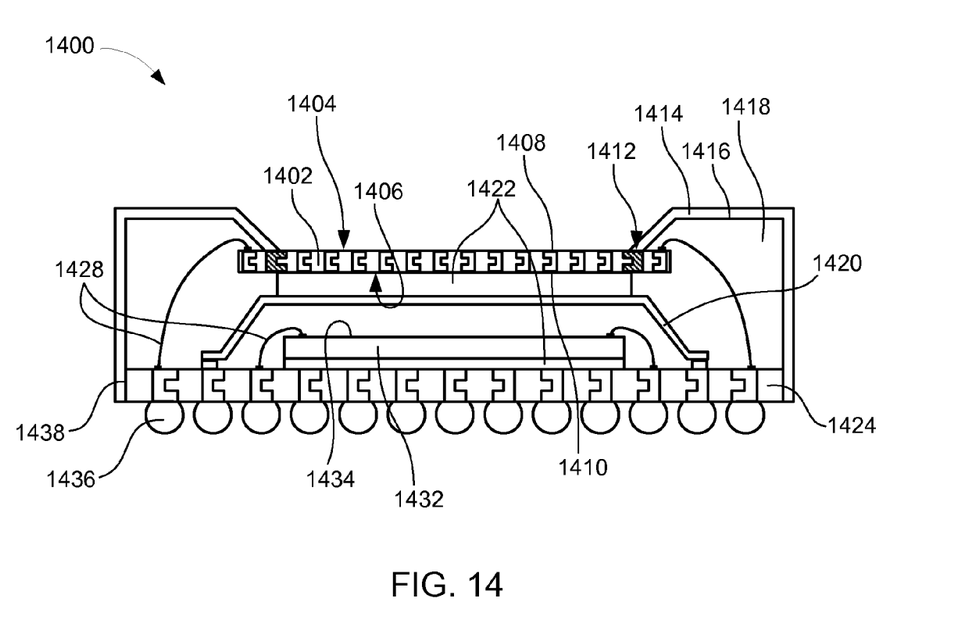
FIG. 14 is a cross-sectional view of an integrated circuit package system in a fourth embodiment of the present invention.

Referring now to FIG. 14, therein is shown a cross-sectional view of an integrated circuit package system 1400 in a fourth embodiment of the present invention. The integrated circuit package system 1400 is shown having a structure such as an interposer 1402.

The interposer 1402 is shown having two functional sides, such as a first functional side 1404 and a second functional side 1406, which allow electrical signals to be routed between exposed conductors, such as exposed conductors 1408, exposed from the first functional side 1404, and exposed conductors 1410, exposed from the second functional side 1406.

Further, exposed from the first functional side 1404 and exposed from the second functional side 1406 are grounding pads 1412. It has been unexpectedly discovered that the use of the grounding pads 1412 on the interposer 1402 allows for an exceptionally compact grounding of a conformal shielding 1414, while still allowing the functionality of multiple fan-in inputs into the package via the interposer 1402.

The interposer 1402 is typically a UV stabilized woven glass and epoxy resin with etched copper conductive pathways. The conformal shielding 1414 is attached to an exterior surface 1416 of an encapsulation 1418. The conformal shielding 1414 such as a thin-film copper or aluminum shield acts as a faraday cage, protecting the internal components of the package from RF interference.

The interposer 1402 is partially exposed from the encapsulation 1418. Below the interposer 1402, an external shielding cage 1420 is attached with die attach adhesive 1422. The shielding cage 1420 is connected to a substrate 1424. The substrate may be a laminated plastic or ceramic substrate and has grounding pads 1412.

The substrate 1424 is connected to the first functional side 1404 of the interposer 1402 with bond wires 1428. Between the shielding cage 1402 and the substrate 1424, an integrated circuit such as a wire-bonded die 1432 with an active side 1434 is mounted to the substrate 1424.

The wire-bonded die 1432 is attached to the substrate 1424 with the die attach adhesive 1422 and the active side 1434 of the wire-bonded die 1432 is connected to the substrate 1424 with the bond wires 1428. Mounted below the substrate 1424 are external interconnects 1436 such as solder balls.

The encapsulation 1418 encapsulates the wire-bonded die 1432 and the bond wires 1428. The conformal shielding 1414 attached to the exterior surface 1416 of the encapsulation 1418 is also attached to a vertical edge 1438 of the substrate 1424.

Figure 15:
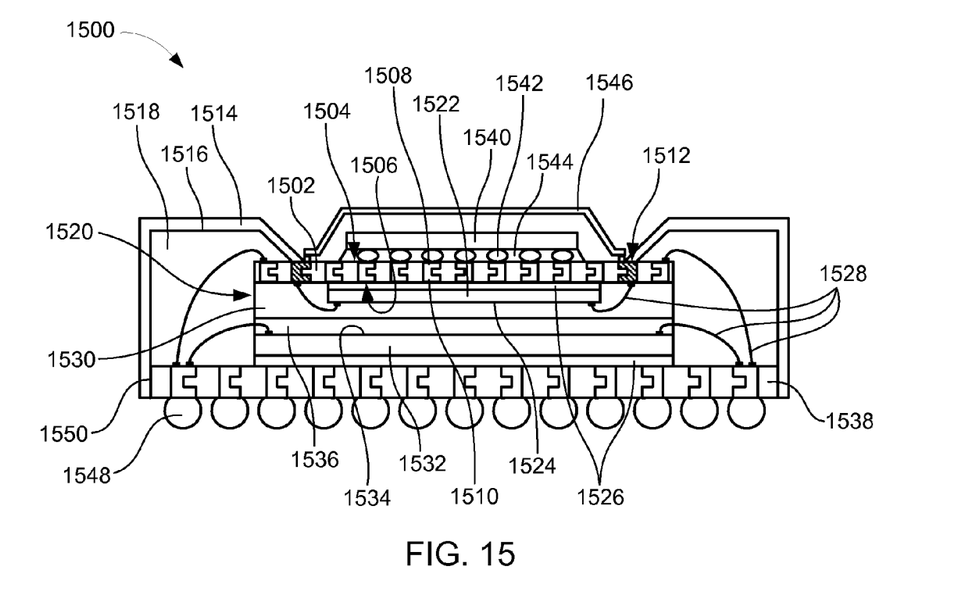
FIG. 15 is a cross-sectional view of an integrated circuit package system in a fifth embodiment of the present invention.

Referring now to FIG. 15, therein is shown a cross-sectional view of an integrated circuit package system 1500 in a fifth embodiment of the present invention. The integrated circuit package system 1500 is shown having a structure such as an interposer 1502.

The interposer 1502 is shown having two functional sides, such as a first functional side 1504 and a second functional side 1506, which allow electrical signals to be routed between exposed conductors, such as exposed conductors 1508, exposed from the first functional side 1504, and exposed conductors 1510, exposed from the second functional side 1506.

Further, exposed from the first functional side 1504 and exposed from the second functional side 1506 are grounding pads 1512. It has been unexpectedly discovered that the use of the grounding pads 1512 on the interposer 1502 allows for an exceptionally compact grounding of a conformal shielding 1514, while still allowing the functionality of multiple fan-in inputs into the package via the interposer 1502.

The interposer 1502 is typically a UV stabilized woven glass and epoxy resin with etched copper conductive pathways. The conformal shielding 1514 is attached to an exterior surface 1516 of an encapsulation 1518. The conformal shielding 1514 such as a thin-film copper or aluminum shield acts as a faraday cage, protecting the internal components of the package from RF interference.

The interposer 1502 is partially exposed from the encapsulation 1518. The interposer 1502 is part of an inner stacking module (ISM) 1520. The ISM 1520 includes an ISM wire-bonded die 1522 with an active side 1524 mounted below the interposer 1502. The ISM wire-bonded die 1522 is attached to the interposer 1502 with a die attach adhesive 1526.

The active side 1524 of the ISM wire-bonded die 1522 is connected to the exposed conductors 1510 exposed from the second functional side 1506 of the interposer 1502 with interconnects such as bond wires 1528. The ISM wire-bonded die 1522 is encapsulated by an ISM encapsulation 1530.

Below the ISM 1520, an integrated circuit such as a wire-bonded die 1532 with an active side 1534 is mounted with the active side 1534 facing the ISM 1520. The active side 1534 of the wire-bonded die 1532 is attached to the ISM 1520 with a wire-in-film adhesive 1536.

The wire-in-film adhesive 1536 has a low viscosity and, as temperature increases, the viscosity gets lower. Therefore, the wire-in-film adhesive 1536 can be easily pressed above and around the wire-bonded die 1532 and then cured to harden the wire-in-film adhesive 1536.

It has been discovered that the wire-in-film adhesive 1536 should be a thermally conductive dielectric material. The wire-in-film adhesive 1536 can be made of a B-stage material that can be hardened after curing and can maintain a predetermined thickness.

The active side 1534 of the wire-bonded die 1532 is connected to a substrate 1538 mounted below the wire-bonded die 1532 with the bond wires 1528. The substrate 1538 may be a laminated plastic or ceramic substrate and is attached with the die attach adhesive 1526.

The interposer 1502 is also connected to the substrate 1538 with the bond wires 1528. The grounding pads 1512 are exposed from the substrate 1538. Mounted above the interposer 1502 is an integrated circuit package or integrated circuit die such as a flip chip 1540.

The flip chip 1540 is connected to the interposer 1502 with interconnections such as solder bumps 1542. Between the solder bumps 1542 is an under fill 1544. The under fill 1544 helps to ruggedize the connection of the flip chip 1540 to the interposer 1502.

Mounted around the flip chip 1540 is a shielding cage 1546. The shielding cage 1546 is connected to the grounding pads 1512 exposed from the interposer 1502. Mounted below the substrate 1538 are external interconnects 1548 such as solder balls.

The encapsulation 1518 encapsulates the wire-bonded die 1532 and the bond wires 1528. The conformal shielding 1514 attached to the exterior surface 1516 of the encapsulation 1518 is also attached to a vertical edge 1550 of the substrate 1538.

Figure 16:
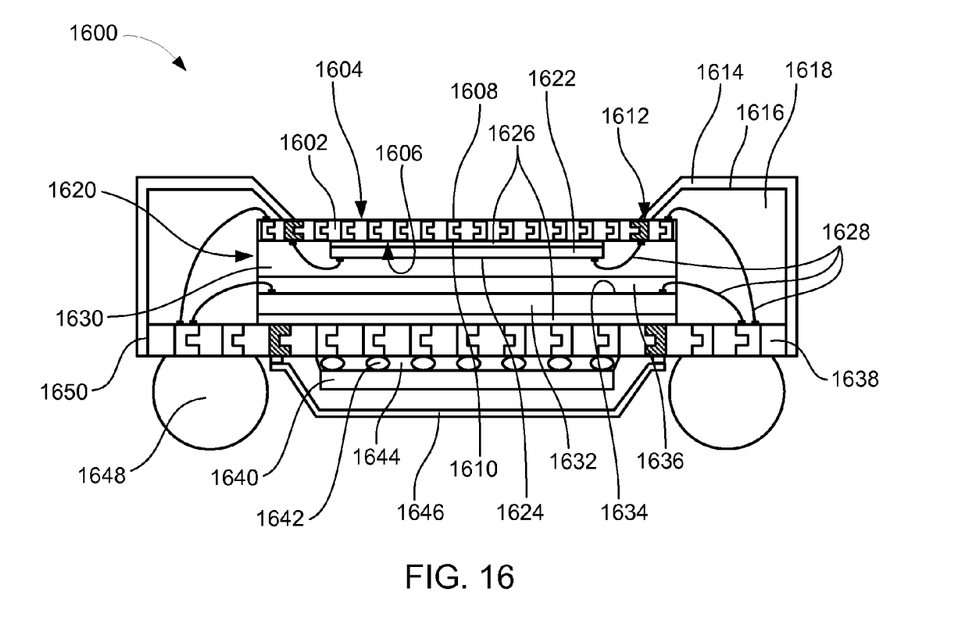
FIG. 16 is a cross-sectional view of an integrated circuit package system in a sixth embodiment of the present invention.

Referring now to FIG. 16, therein is shown a cross-sectional view of an integrated circuit package system 1600 in a sixth embodiment of the present invention. The integrated circuit package system 1600 is shown having a structure such as an interposer 1602.

The interposer 1602 is shown having two functional sides, such as a first functional side 1604 and a second functional side 1606, which allow electrical signals to be routed between exposed conductors, such as exposed conductors 1608, exposed from the first functional side 1604, and exposed conductors 1610, exposed from the second functional side 1606.

Further, exposed from the first functional side 1604 and exposed from the second functional side 1606 are grounding pads 1612. It has been unexpectedly discovered that the use of the grounding pads 1612 on the interposer 1602 allows for an exceptionally compact grounding of a conformal shielding 1614, while still allowing the functionality of multiple fan-in inputs into the package via the interposer 1602.

The interposer 1602 is typically a UV stabilized woven glass and epoxy resin with etched copper conductive pathways. The conformal shielding 1614 is attached to an exterior surface 1616 of an encapsulation 1618. The conformal shielding 1614 such as a thin-film copper or aluminum shield acts as a faraday cage, protecting the internal components of the package from RF interference.

The interposer 1602 is partially exposed from the encapsulation 1618. The interposer 1602 is part of an inner stacking module (ISM) 1620. The ISM 1620 includes an ISM wire-bonded die 1622 with an active side 1624 mounted below the interposer 1602. The ISM wire-bonded die 1622 is attached to the interposer 1602 with a die attach adhesive 1626.

The active side 1624 of the ISM wire-bonded die 1622 is connected to the exposed conductors 1610 exposed from the second functional side 1606 of the interposer 1602 with interconnects such as bond wires 1628. The ISM wire-bonded die 1622 is encapsulated by an ISM encapsulation 1630.

Below the ISM 1620, an integrated circuit such as a wire-bonded die 1632 with an active side 1634 is mounted with the active side 1634 facing the ISM 1620. The active side 1634 of the wire-bonded die 1632 is attached to the ISM 1620 with a wire-in-film adhesive 1636.

The wire-in-film adhesive 1636 has a low viscosity and, as temperature increases, the viscosity gets lower. Therefore, the wire-in-film adhesive 1636 can be easily pressed above and around the wire-bonded die 1632 and then cured to harden the wire-in-film adhesive 1636.

It has been discovered that the wire-in-film adhesive 1636 should be a thermally conductive dielectric material. The wire-in-film adhesive 1636 can be made of a B-stage material that can be hardened after curing and can maintain a predetermined thickness.

The active side 1634 of the wire-bonded die 1632 is connected to a substrate 1638 mounted below the wire-bonded die 1632 with the bond wires 1628. The substrate 1638 may be a laminated plastic or ceramic substrate and is attached with the die attach adhesive 1626.

The interposer 1602 is also connected to the substrate 1638 with the bond wires 1628. The grounding pads 1612 are exposed from the substrate 1638. Mounted below the substrate 1638 is an integrated circuit package or integrated circuit die such as a flip chip 1640.

The flip chip 1640 is connected to the substrate 1638 with interconnections such as solder bumps 1642. Between the solder bumps 1642 is an under fill 1644. The under fill 1644 helps to ruggedize the connection of the flip chip 1640 to the substrate 1638.

Mounted around the flip chip 1640 is a shielding cage 1646. The shielding cage 1646 is connected to the grounding pads 1612 exposed from the substrate 1638. Mounted below the substrate 1638 are external interconnects 1648 such as solder balls.

The encapsulation 1618 encapsulates the wire-bonded die 1632 and the bond wires 1628. The conformal shielding 1614 attached to the exterior surface 1616 of the encapsulation 1618 is also attached to a vertical edge 1650 of the substrate 1638.

Figure 17:
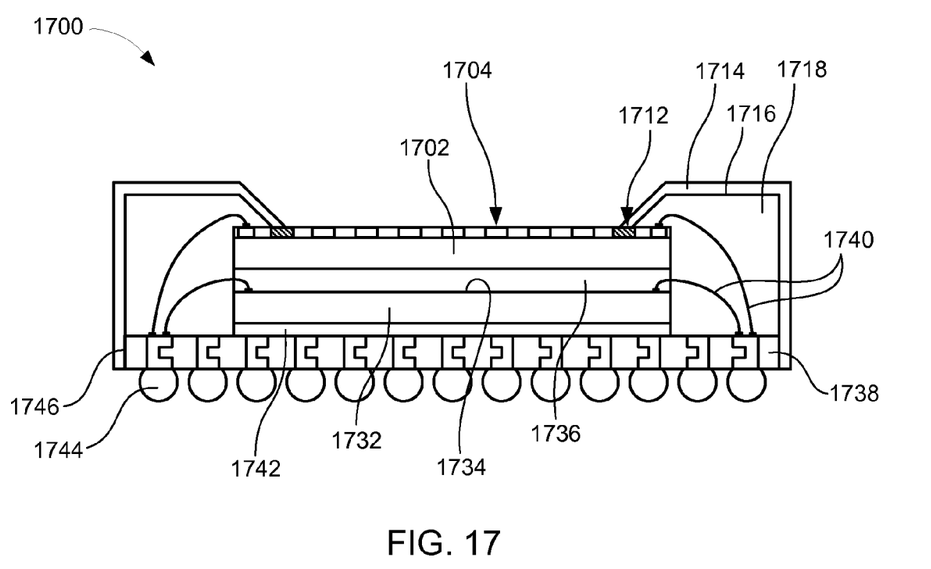
FIG. 17 is a cross-sectional view of an integrated circuit package system in a seventh embodiment of the present invention.

Referring now to FIG. 17, therein is shown a cross-sectional view of an integrated circuit package system 1700 in a seventh embodiment of the present invention. The integrated circuit package system 1700 is shown having a structure such as an exposed integrated circuit die 1702 with a functional side 1704.

The functional side 1704 of the exposed integrated circuit die 1702 has grounding pads 1712. It has been unexpectedly discovered that the use of the grounding pads 1712 on the exposed integrated circuit die 1702 allows for an exceptionally compact grounding of a conformal shielding 1714, while still allowing the functionality of multiple fan-in inputs into the package via the exposed integrated circuit die 1702.

The conformal shielding 1714 is attached to an exterior surface 1716 of an encapsulation 1718. The conformal shielding 1714 such as a thin-film copper or aluminum shield acts as a faraday cage, protecting the internal components of the package from RF interference.

The exposed integrated circuit die 1702 is partially exposed from the encapsulation 1718. Below the exposed integrated circuit die 1702, an integrated circuit such as a wire-bonded die 1732 with an active side 1734 is mounted with the active side 1734 facing the exposed integrated circuit die 1702. The active side 1734 of the wire-bonded die 1732 is attached to the exposed integrated circuit die 1702 with a wire-in-film adhesive 1736.

The wire-in-film adhesive 1736 has a low viscosity and, as temperature increases, the viscosity gets lower. Therefore, the wire-in-film adhesive 1736 can be easily pressed above and around the wire-bonded die 1732 and then cured to harden the wire-in-film adhesive 1736.

It has been discovered that the wire-in-film adhesive 1736 should be a thermally conductive dielectric material. The wire-in-film adhesive 1736 can be made of a B-stage material that can be hardened after curing and can maintain a predetermined thickness.

The active side 1734 of the wire-bonded die 1732 is connected to a substrate 1738 mounted below the wire-bonded die 1732 with the bond wires 1740. The substrate 1738 may be a laminated plastic or ceramic substrate and is attached with a die attach adhesive 1742.

The exposed integrated circuit die 1702 is also connected to the substrate 1738 with bond wires 1740. Mounted below the substrate 1738 are external interconnects 1744 such as solder balls.

The encapsulation 1718 encapsulates the wire-bonded die 1732 and the bond wires 1740. The conformal shielding 1714 attached to the exterior surface 1716 of the encapsulation 1718 is also attached to a vertical edge 1746 of the substrate 1738.

Figure 18:
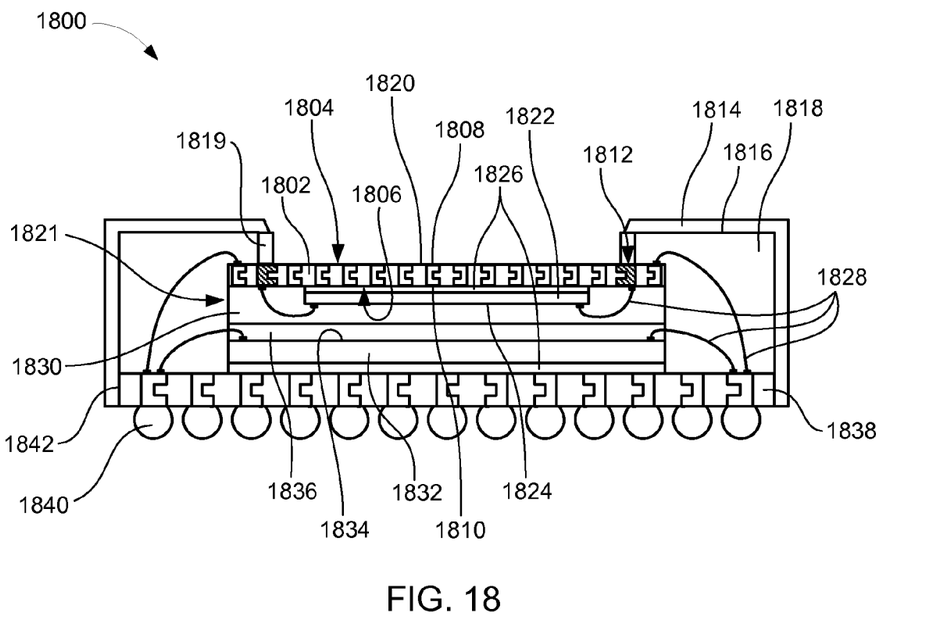
FIG. 18 is a cross-sectional view of an integrated circuit package system in an eighth embodiment of the present invention.

Referring now to FIG. 18, therein is shown a cross-sectional view of an integrated circuit package system 1800 in an eighth embodiment of the present invention. The integrated circuit package system 1800 is shown having a structure such as an interposer 1802.

The interposer 1802 is shown having two functional sides, such as a first functional side 1804 and a second functional side 1806, which allow electrical signals to be routed between exposed conductors, such as exposed conductors 1808, exposed from the first functional side 1804, and exposed conductors 1810, exposed from the second functional side 1806.

Further, exposed from the first functional side 1804 and exposed from the second functional side 1806 are grounding pads 1812. It has been unexpectedly discovered that the use of the grounding pads 1812 on the interposer 1802 allows for an exceptionally compact grounding of a conformal shielding 1814, while still allowing the functionality of multiple fan-in inputs into the package via the interposer 1802.

The interposer 1802 is typically a UV stabilized woven glass and epoxy resin with etched copper conductive pathways. The conformal shielding 1814 is attached to an exterior surface 1816 of an encapsulation 1818. The conformal shielding 1814 is electrically connected to the grounding pads 1812 with a conductive stiffener ring 1819.

The conductive stiffener ring encircles the exposed surface 1820 of the interposer 1802. The conformal shielding 1814 such as a thin-film copper or aluminum shield acts as a faraday cage, protecting the internal components of the package from RF interference.

The interposer 1802 is part of an inner stacking module (ISM) 1821. The ISM 1821 includes an ISM wire-bonded die 1822 with an active side 1824 mounted below the interposer 1802. The ISM wire-bonded die 1822 is attached to the interposer 1802 with a die attach adhesive 1826.

The active side 1824 of the ISM wire-bonded die 1822 is connected to the exposed conductors 1810 exposed from the second functional side 1806 of the interposer 1802 with interconnects such as bond wires 1828. The ISM wire-bonded die 1822 is encapsulated by an ISM encapsulation 1830.

Below the ISM 1821, an integrated circuit such as a wire-bonded die 1832 with an active side 1834 is mounted with the active side 1834 facing the ISM 1821. The active side 1834 of the wire-bonded die 1832 is attached to the ISM 1821 with a wire-in-film adhesive 1836.

The wire-in-film adhesive 1836 has a low viscosity and, as temperature increases, the viscosity gets lower. Therefore, the wire-in-film adhesive 1836 can be easily pressed above and around the wire-bonded die 1832 and then cured to harden the wire-in-film adhesive 1836.

It has been discovered that the wire-in-film adhesive 1836 should be a thermally conductive dielectric material. The wire-in-film adhesive 1836 can be made of a B-stage material that can be hardened after curing and can maintain a predetermined thickness.

The active side 1834 of the wire-bonded die 1832 is connected to a substrate 1838 mounted below the wire-bonded die 1832 with the bond wires 1828. The substrate 1838 may be a laminated plastic or ceramic substrate and is attached with a die attach adhesive 1828.

The interposer 1802 is also connected to the substrate 1838 with the bond wires 1828. Mounted below the substrate 1838 are external interconnects 1840 such as solder balls. The encapsulation 1818 encapsulates the wire-bonded die 1832 and the bond wires 1828.

The conformal shielding 1814 attached to the exterior surface 1816 of the encapsulation 1818 is also attached to a vertical edge 1842 of the substrate 1838.

Figure 19:
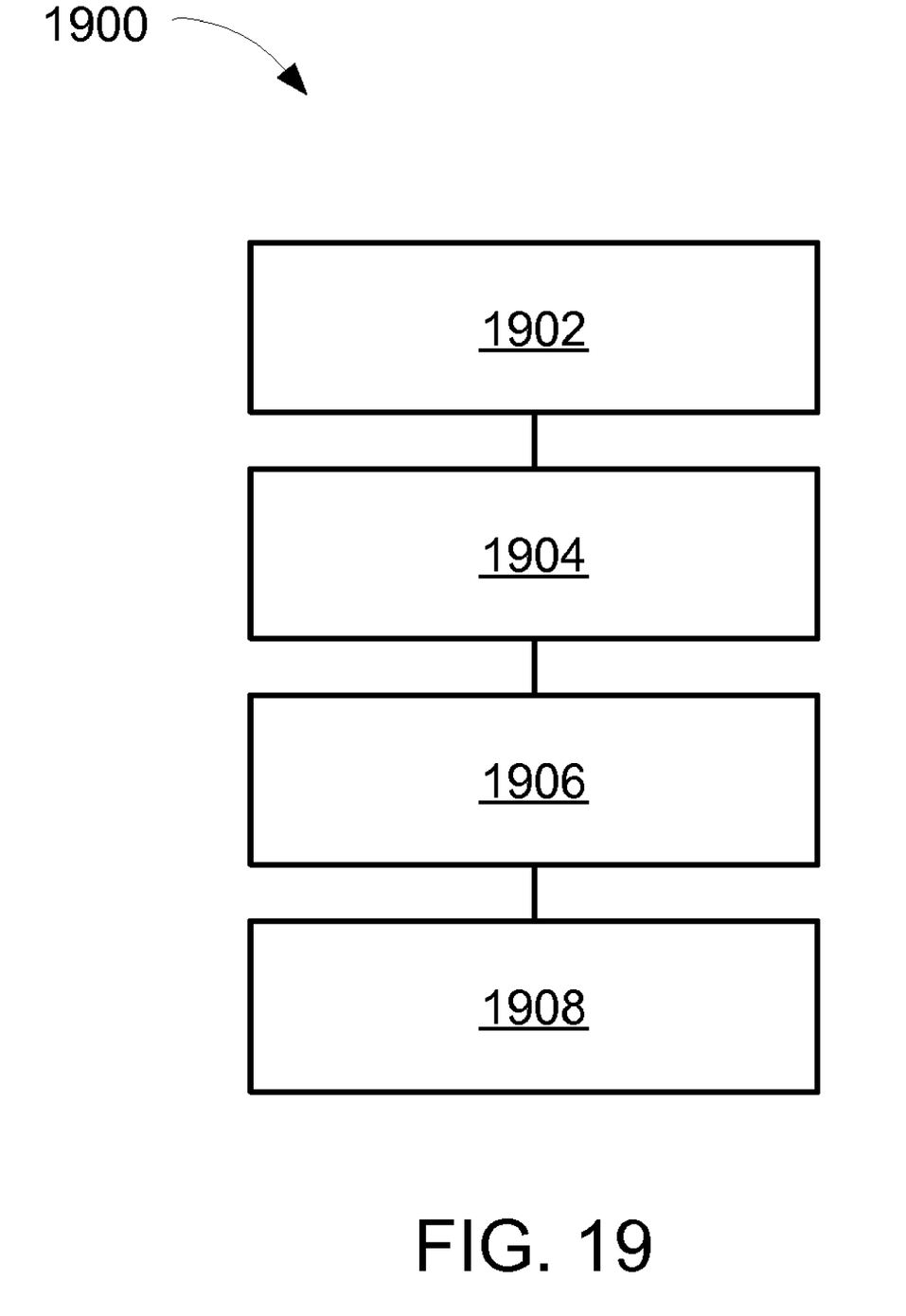
FIG. 19 is a flow chart of a system for manufacturing the integrated circuit package system of FIG. 1 in an embodiment of the present invention.

Referring now to FIG. 19, therein is shown a flow chart of a system 1900 for manufacturing the integrated circuit package system 100 of FIG. 1 in an embodiment of the present invention. The system 1900 includes providing a substrate with an integrated circuit mounted thereover in a block 1902; mounting a structure, having ground pads, over the integrated circuit in a block 1904; encapsulating the integrated circuit with an encapsulation while leaving the structure partially exposed in a block 1906; and attaching a conformal shielding to the encapsulation and electrically connected to the grounding pads in a block 1908.

Thus, it has been discovered that the conformal shielding of the present invention furnishes important and heretofore unknown and unavailable solutions, capabilities, and functional aspects for integrated circuit package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a substrate with an integrated circuit mounted thereover;
   mounting a structure, having grounding pads, over the integrated circuit;
   encapsulating the integrated circuit with an encapsulation, having a side exterior surface and a top exterior surface, while leaving the structure partially exposed; and
   attaching a conformal shielding to the side exterior surface and to the top exterior surface of the encapsulation and with the conformal shielding on and around the perimeter of a side of the structure opposite the integrated circuit and electrically connected to the grounding pads.

2. The method as claimed in claim 1 wherein:
   mounting the structure includes mounting an interposer, or an exposed integrated circuit die.

3. The method as claimed in claim 1 wherein:
   attaching the conformal shielding to the encapsulation includes attaching a protective cover above the structure leaving substantial portions of the grounding pads exposed.

4. The method as claimed in claim 1 further comprising:
   attaching the conformal shielding to a vertical edge of the substrate, or singulating the substrate having a vertical edge exposed.

5. The method as claimed in claim 1 wherein:
   attaching the conformal shielding to the encapsulation and electrically connected to the grounding pads includes connecting the conformal shield to the grounding pads with a conductive stiffener ring.

6. A method for manufacturing an integrated circuit package system comprising:
   providing a substrate with grounding pads and with an integrated circuit attached thereto with a die attach adhesive;
   mounting a structure, having grounding pads, over the integrated circuit;
   connecting the structure and the integrated circuit to the substrate with a bond wire;
   encapsulating the integrated circuit with an encapsulation, having a side exterior surface and a top exterior surface, while leaving the structure partially exposed; and
   attaching a conformal shielding to the side exterior surface and to the top exterior surface of the encapsulation and with the conformal shielding on and around the perimeter of a side of the structure opposite the integrated circuit and electrically connected to the grounding pads.

7. The method as claimed in claim 6 further comprising:
   mounting a shielding cage below the interposer;
   connecting the shielding cage to the grounding pads on the interposer; and
   wherein:
   encapsulating the integrated circuit includes encapsulating the shielding cage.

8. The method as claimed in claim 6 further comprising:
   mounting a shielding cage below the interposer;
   connecting the shielding cage to the grounding pads on the substrate; and
   wherein:
   encapsulating the integrated circuit includes encapsulating the shielding cage.

9. The method as claimed in claim 6 further comprising:
   mounting a shielding cage above the interposer; and
   connecting the shielding cage to the grounding pads on the interposer.

10. The method as claimed in claim 6 further comprising:
    mounting a shielding cage below the substrate; and
    connecting the shielding cage to the grounding pads on the substrate.

11. An integrated circuit package system comprising:
    a substrate with an integrated circuit mounted thereover;
    a structure, having grounding pads, mounted over the integrated circuit;
    an encapsulation, having a side exterior surface and a top exterior surface, encapsulating the integrated circuit while leaving the structure partially exposed; and
    a conformal shielding attached to the side exterior surface and to the top exterior surface of the encapsulation and with the conformal shielding on and around the perimeter of a side of the structure opposite the integrated circuit and electrically connected to the grounding pads.

12. The system as claimed in claim 11 wherein:
    the structure is an interposer.

13. The system as claimed in claim 11 wherein:
    the structure is an exposed integrated circuit die.

14. The system as claimed in claim 11 further comprising:
    a vertical edge of the substrate with the conformal shielding attached thereto, or a vertical edge of the substrate is exposed.

15. The system as claimed in claim 11 wherein:
    the conformal shield is connected to the grounding pads with a conductive stiffener ring.

16. The system as claimed in claim 11 further comprising:
    grounding pads on the substrate and the integrated circuit attached thereto with a die attach adhesive; and
    a bond wire connecting the structure and the integrated circuit to the substrate.

17. The system as claimed in claim 16 further comprising:
    a shielding cage below the interposer;
    wherein:
    the shielding cage is connected to the grounding pads on the interposer; and
    the shielding cage is encapsulated with the encapsulation.

18. The system as claimed in claim 16 further comprising:
    a shielding cage below the interposer;
    wherein:
    the shielding cage is connected to the grounding pads on the substrate; and
    the shielding cage is encapsulated with the encapsulation.

19. The system as claimed in claim 16 further comprising:
    a shielding cage mounted above the interposer; and
    wherein:
    the shielding cage is connected to the grounding pads on the interposer.

20. The system as claimed in claim 16 further comprising:
    a shielding cage mounted below the substrate; and
    wherein:
    the shielding cage is connected to the grounding pads on the substrate.

* * * * *